(12) United States Patent
Xi et al.

(10) Patent No.: US 8,179,716 B2
(45) Date of Patent: *May 15, 2012

(54) NON-VOLATILE PROGRAMMABLE LOGIC GATES AND ADDERS

(75) Inventors: Haiwen Xi, Prior Lake, MN (US); Yang Li, Shoreview, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/953,544

(22) Filed: Nov. 24, 2010

(65) Prior Publication Data

US 2011/0068825 A1 Mar. 24, 2011

Related U.S. Application Data

(63) Continuation of application No. 12/125,975, filed on May 23, 2008, now Pat. No. 7,852,663.

(51) Int. Cl.
G11C 11/00 (2006.01)

(52) U.S. Cl. ........ 365/158; 365/171; 365/173; 365/209; 365/66

(58) Field of Classification Search .................. 365/158, 365/171, 173, 209, 225.5, 66
See application file for complete search history.

(56) References Cited

U.S. PATENT DOCUMENTS

| | | | |
|---|---|---|---|
| 4,733,371 A | 3/1988 | Terada | |
| 5,191,223 A | 3/1993 | Munekata | |
| 5,646,419 A | 7/1997 | McCaldin | |
| 5,673,225 A | 9/1997 | Jeong | |
| 5,761,115 A | 6/1998 | Kozocki | |
| 5,920,446 A | 7/1999 | Gill | |
| 5,982,670 A | 11/1999 | Yamashita | |
| 6,072,718 A | 6/2000 | Abraham | |
| 6,178,136 B1 | 1/2001 | Lin | |
| 6,226,197 B1 | 5/2001 | Nishimura | |
| 6,252,796 B1 | 6/2001 | Lenssen | |
| 6,381,106 B1 | 4/2002 | Pinarbasi | |
| 6,469,926 B1 | 10/2002 | Chen | |
| 6,532,164 B2 | 3/2003 | Redon | |

(Continued)

FOREIGN PATENT DOCUMENTS

GB 2 422 735 8/2006

(Continued)

OTHER PUBLICATIONS

Baek et al., Tech. Dig. IEDM (2004) 587.

(Continued)

*Primary Examiner* — Tuan T Nguyen
*Assistant Examiner* — Toan Le
(74) *Attorney, Agent, or Firm* — Mueting, Raasch & Gebhardt PA (57) ABSTRACT

Spin torque magnetic logic device having at least one input element and an output element. Current is applied through the input element(s), and the resulting resistance or voltage across the output element is measured. The input element(s) include a free layer and the output element includes a free layer that is electrically connected to the free layer of the input element. The free layers of the input element and the output element may be electrically connected via magnetostatic coupling, or may be physically coupled. In some embodiments, the output element may have more than one free layer.

20 Claims, 5 Drawing Sheets

U.S. PATENT DOCUMENTS

| | | |
|---|---|---|
| 6,542,000 B1 | 4/2003 | Black |
| 6,569,745 B2 | 5/2003 | Hsu |
| 6,584,016 B2 | 6/2003 | Park |
| 6,602,677 B1 | 8/2003 | Wood et al. |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhattacharyya |
| 6,774,391 B1 | 8/2004 | Cowburn |
| 6,781,867 B2 | 8/2004 | Kurth |
| 6,801,415 B2 | 10/2004 | Slaughter |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,709 B2 | 5/2005 | Princinsky et al. |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Chua-Eoan et al. |
| 7,826,259 B2 | 11/2010 | Lou |
| 7,852,663 B2 * | 12/2010 | Xi et al. .................. 365/158 |
| 7,881,098 B2 | 2/2011 | Xi |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0141640 A1 | 6/2006 | Huai |
| 2006/0233017 A1 | 10/2006 | Hosotami |
| 2006/0245117 A1 | 11/2006 | Nowak |
| 2007/0002504 A1 | 1/2007 | Huai et al. |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |

| | | |
|---|---|---|
| 2007/0297220 A1 | 12/2007 | Yoshikawa |
| 2008/0026253 A1 | 1/2008 | Yuasa |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0265347 A1 | 10/2008 | Iwayama |
| 2008/0273380 A1 | 11/2008 | Diao |
| 2008/0291721 A1 | 11/2008 | Apalkov |
| 2008/0310213 A1 | 12/2008 | Chen et al. |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0302403 A1 | 12/2009 | Nguyen |
| 2010/0034009 A1 | 2/2010 | Lu |
| 2010/0118600 A1 | 5/2010 | Nagase |
| 2010/0176471 A1 | 7/2010 | Zhu |

FOREIGN PATENT DOCUMENTS

WO   WO 2008/100868   8/2008

OTHER PUBLICATIONS

Chu et al., Fabrication of Ideally Ordered Nanoporous Alumina Films and Integrated Alumina Nanotubule Arrays by High-Field Anodization, Adv. Mater. 2005, 17, 2115-2119.

de Groot et al., New Class of Materials: Half-Metallic Ferromagnets, Physics Review Letters, 50, 2024 (1983).

Egelhoff et al., Oxygen as a Surfactant in the Growth of Giant Magnetoresistance Spin Valves, Journal of Applied Physics 82 (12), Dec. 15 1997.

Emley, N.C., et al., Reduction of Spin Transfer by Synthetic Antiferromagnets, Applied Physics Letters, May 24, 2004, pp. 4257-4259, vol. 84, No. 21.

Folk et al., A Gate-Controlled Bidirectional Spin Filter Using Quantum Coherence, Science, vol. 299, Jan. 31, 2003, pp. 679-682.

Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.

Huczko, Template-Based Synthesis of Nanomaterials, Appl. Phys. A 70, 365-376 (2000).

Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.

Korenivski, et al., Thermally Activated Switching in Spin-Flop Tunnel Junctions, Applied Physics Letters 86, 252506 (2005).

Li et al., Role of Oxygen Exposure in Different Positions in the Synthetic Spin Valves, Journal of Applied Physics, vol. 93, No. 10, May 15 2003.

Macak et al., High-Aspect-Ratio TiO2, Nanotubes by Anodization of Titanium, Angew. Chem. Int. Ed. 2005, 44, 2100-2102.

Masuda and Kenji Fukuda, Science, 268, 1466 91995).

Masuda et al., Ordered Metal Nanohole Arrays Made by a Two-Step Replication of Honeycomb Structures of Anodic Alumina, Science, OI. 268, Jun. 9, 1995.

Meng et al., Spin Transfer in Nanomagnetic Devices with Perpendicular Anistropy, Applied Physics Letters 88, 172506 (2006).

PCT Search Report and Written Opinion dated Oct. 4, 2010, Our Ref: 15010WO00.

PCT Search Report and Written Opinion dated Mar. 10, 2010, Our Ref: 13835WO00.

PCT Search Report and Written Opinion dated Mar. 22, 2010, Our Ref: 14647WO00.

Prejbeanu et al., Thermally Assisted MRAM, J. Phys. Condens. Matter 19 (2007) 165218 (23 pp).

Seki et al., Spin-Polarized Current-Induced Magnetization Reversal in Perpendicularly Magnetized L1o-FePt Layers, Applied Physics Letters 88, 172504 (2006).

Sharrock, Time Dependence of Switching Fields in Magnetic Recording Media (Invited), J. Appl. Phys. 76 (10), Nov. 15, 1994.

Slonczewski et al., Current-Driven Excitation of Magnetic Multilayers, Journal of Magnetism and Magnetic Materials 159 (1996) L1-L7.

Sun, "Spin-Current Interaction with a Monodomain Magnetic Body: A Model Study", Physical Review B, vol. 62, No. 1, (2000), pp. 570-578.

Sun, Current-Driven Magnetic Switching in Manganite Trilayer Junctions, Journal of Magnetism and Magnetic Materials 202 (1999) 157-162.

Thurn-Albrecht et al., Science, 290, 2126 (2000).

U.S. Appl. No. 12/416,976, filed Apr. 2, 2009, Inventor: Zheng, Our Ref: 14630.

U.S. Appl. No. 12/106,382, filed Apr. 21, 2008, Inventors: Xi et al.

U.S. Appl. No. 12/125,975, filed May 23, 2008, Inventor: Xi, Our Ref: 13866.00.

U.S. Appl. No. 12/170,519, filed Jul. 10, 2008, Inventors: Xi et al.

U.S. Appl. No. 12/175,545, filed Jul. 18, 2008, Inventor: Lou.

U.S. Appl. No. 12/239,882, filed Sep. 29, 2008, Inventor: Zheng et al.

U.S. Appl. No. 12/239,887, filed Sep. 29, 2008; Inventor: Zheng, Our Ref: 1011.14596.00.

U.S. Appl. No. 12/258,476, filed Oct. 27, 2008, Inventor: Lou.

U.S. Appl. No. 12/258,491, filed Oct. 27, 2008, Inventor: Lou.

U.S. Appl. No. 12/258,492, filed Oct. 27, 2008, Inventor: Lou.

U.S. Appl. No. 12/269,507, filed Nov. 12, 2008, Inventor: Tian.

U.S. Appl. No. 12/269,514, filed Nov. 12, 2008, Inventor: Venkatasamy.

U.S. Appl. No. 12/269,537, filed Nov. 12, 2008, Inventor: Tang et al.

U.S. Appl. No. 12/396,905, filed Mar. 3, 2009, Inventor: Gao, Our Ref: 14689.

U.S. Appl. No. 12/398,214, filed Mar. 5, 2009, Inventor: Wang et al.

U.S. Appl. No. 12/425,457, filed Apr. 17, 2009, Inventor: Gao (14787).

Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).

Wendt et al., Electronic and Vibrational Properties of Ultrathin SiO2 Films Grown on Mo(112), 2005, Phys. Rev. vol. B72, pp. 1150409-1-115409.0.

Yan et al., Magnesium Oxide as a Candidate High-k Gate Dielectric, 2006, Applied Physics Lett. vol. 88, pp. 142901-1-142901-3.

Yen et al., Reduction in Critical Current Density for Spin Torque Transfer Switching with Composite Free Layer, Applied Physics Letters 93, 092504 (2008).

Zheng et al., Low Switching Current Flux-Closed Magnetoresistive Random Access Memory, Journal of Applied Physics, May 15, 2003.

Zheng et al., Magnetic Random Access Memory (MRAM), Journal of Nanoscience and Nanotechnology, vol. 7, 117-137 (2007).

Zhuang et al., Tech Dig. IEDM (2002) 193.

K. Miura et al., A novel STRAM with a synthetic ferrigmagnetic free layer . . . , VLSI Symposium on VLSI Tech., Digest of Techinal Papers (2007).

A. Ney et al, Programmable Computing with a Single Magnetoresistive Element, Nature 425, 485 (2003).

L. Berger, Emission of Spin Waves bya Magnetic Multilayer Traversed by a Current, Phys. Rev. B 54, 9353 (1996).

W.C. Black, Jr., et al., Programmable Logic Using Giant-Magnetoresistance and Spin-Dependent Tunneling Devices (invited), J. Appl. Phys. 87, 6674 (2000).

H. Meng et al., A Spintronics Full Adder for Magnetic CPU, IEEE Elec. Dev. Lett. 26, 360 92005).

R.P. Cowburn et al., Room Temperature Magnetic Quantum Cellular Automata. Science 287, 1466 (2000).

U.S. Appl. No. 12/126,014, filed May 23, 2008, Inventor: Xiaohou Lou, Our Ref: 14204.00.

* cited by examiner

NON-VOLATILE PROGRAMMABLE LOGIC GATES AND ADDERS

PRIORITY

This application is a continuation of U.S. patent application Ser. No. 12/125,975 entitled, "NON-VOLATILE PROGRAMMABLE LOGIC GATES AND ADDERS", filed on May 23, 2008 now U.S. Pat. No. 7,852,663, the disclosure of which is incorporated herein by reference thereto.

BACKGROUND

This application relates to spin torque transfer devices.

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. Such an element is generally referred to as a "spin tunneling junction," "magnetic tunnel junction" or the like. When the magnetization orientations of the free layer and pinned layer are parallel, the resistance of the element is low. When the magnetization orientations of the free layer and the pinned layer are antiparallel, the resistance of the element is high.

In order to sense the resistance of the magnetic element, current is driven through the magnetic element, either as current in plane ("CIP") or current perpendicular to the plane ("CPP"). In the CIP configuration, current is driven parallel to the layers of the spin valve. In the CPP configuration, current is driven perpendicular to the layers of magnetic element.

At least because of their small size, it is desirous to use magnetic logic elements in many applications. It has been proposed that these spin electronic devices could be used as logic devices. A magnetic field generated by even small currents could program a magnetic element component to several "logic states", i.e., higher resistance or lower resistance. Thus, it would be possible to sense or read the logic state by sending current through the programmed magnetic device and determining its resistance (i.e., whether it has high or low resistance). However, there are deficiencies in the proposed designs. Until this disclosure, complex logic functions can not be realized with magnetic logic devices employing magnetic fields. The present disclosure provides advanced programmable or reconfigurable magnetic devices that utilize an input magnetic element magnetostatically coupled to an output magnetic element.

BRIEF SUMMARY

The present disclosure relates to spin torque magnetic logic devices having at least two magnetic elements, at least one being an input element and one being an output element. Current is applied through the input element(s), and the resulting resistance across the output element is measured. Alternately, the resulting voltage across the output element is measured. The input element(s) include a free layer and the output element includes a free layer that is electrically connected to the free layer of the input element. The free layers of the input element and the output element may be electrically connected via magnetostatic coupling, or may be physically coupled. In some embodiments, the output element may have more than one free layer.

A first particular embodiment of this disclosure is to a magnetic logic device having a first magnetic element comprising a pinned layer, a free layer, and a barrier layer therebetween, the pinned layer and the free layer each having a magnetization orientation. The magnetic logic device also includes an output magnetic element positioned adjacent the first input magnetic element, the output magnetic element comprising at least one free layer, with the at least one free layer of the output magnetic element electrically coupled to the free layer of the input magnetic element. A current input into the input magnetic element provides a flow of electrons through the pinned layer and the free layer. An output sensing circuit electrically connected to the output magnetic element measures the voltage or resistance across the output element.

A second particular aspect of this disclosure is to a magnetic logic device having a first input magnetic element comprising a pinned layer, a free layer, and a barrier layer therebetween, and a second input magnetic element comprising a pinned layer, a free layer, and a barrier layer therebetween. The magnetic logic device also has an output magnetic element comprising at least one free layer, with the free layer of the output magnetic element coupled to the free layer of the first input magnetic element and to the free layer of the second input magnetic element via magnetostatic coupling. Also present is a first current input into the first input magnetic element, to provide a flow of electrons through the pinned layer and the free layer, and a second current input into the second input magnetic element, to provide a flow of electrons through the pinned layer and the free layer. An output sensing circuit is electrically connected to the output magnetic element to measure the voltage or resistance across the output element.

The free layer(s) of the output magnetic element can be electrically coupled to the free layer of the input magnetic element via magnetostatic coupling or by physical coextension.

Depending on the particular configuration of the input and out magnetic elements, the logic device may be an inverter, a follower, an AND gate, or an XOR gate.

These and various other features and advantages will be apparent from the following detailed description.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

All scientific and technical terms used herein have meanings commonly used in the art unless otherwise specified. The definitions provided herein are to facilitate understanding of certain terms used frequently herein and are not meant to limit the scope of the present disclosure.

Figure 1A:
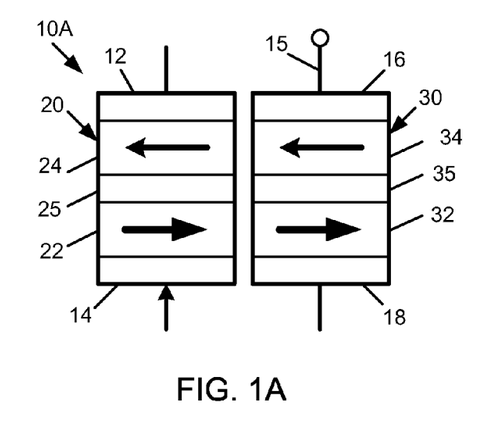
FIGS. 1A and 1B are schematic diagrams of a first embodiment of a logic device according to the present disclosure, in particular a magnetic digital inverter.
Figure 1B:
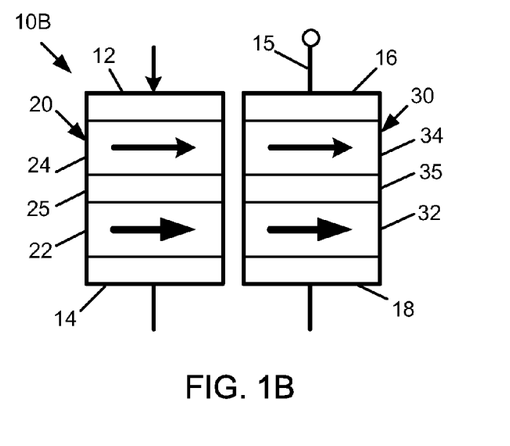

Referring to FIGS. 1A and 1B, an embodiment of a magnetic logic device 10A, 10B, respectively, is diagrammatically illustrated. Although not illustrated herein, logic device 10 is formed on a substrate. The difference between logic device 10A of FIG. 1A and logic device 10B of FIG. 1B will be described below. Logic device 10A, 10B includes a first magnetic element 20 and a second magnetic element 30 physically positioned adjacent to first magnetic element 20. Magnetic elements 20, 30 are positioned sufficiently close to allow magnetostatic coupling (i.e., magnetic dipolar interaction) between the elements. The coupling strength is inversely proportional to the separation of the elements. Thus, it is desirable to have element 20, 30 as close as possible, for example, about 100 nm.

First magnetic element 20 includes a ferromagnetic pinned layer 22, a ferromagnetic free layer 24, and a nonmagnetic barrier layer 25. Each of pinned layer 22 and free layer 24 has a magnetic orientation or magnetization orientation associated therewith. Pinned layer 22 may be pinned by an antiferromagnetic layer or may be a fixed layer without pinning but with a high coercivity to stabilize itself. Pinned layer 22 could be replaced by a synthetic antiferromagnetic (SAF) coupled structure, i.e., two ferromagnetic sublayers separated by a metallic spacer, such as Ru or Cu, with the magnetization orientations of the sublayers in opposite directions.

Barrier layer 25 may be a nonmagnetic metallic material or a nonmagnetic metal oxide material. Second magnetic element 30 includes a ferromagnetic pinned layer 32, a ferromagnetic free layer 34, and a nonmagnetic barrier layer 35. Each of pinned layer 32 and free layer 34 has a magnetic orientation or magnetization orientation associated therewith. Barrier layer 35 may be a nonmagnetic metallic material or a nonmagnetic metal oxide material.

First magnetic element 20 includes electrodes 12, 14 adjacent free layer 24 and pinned layer 22, respectively, and second magnetic element 30 includes electrodes 16, 18 adjacent free layer 34 and pinned layer 32, respectively. Although shown, the invention behind logic device 10A, 10B does not rely on electrodes 12, 14, 16, 18. Note that other layers, such as seed or capping layers, are not depicted for clarity.

Logic device 10A, 10B according to this disclosure includes an input element and an output element. In the embodiment of FIGS. 1A and 1B, first magnetic element 20 is an input element and second magnetic element 30 is an output element. In accordance with this disclosure, an electric current is applied through input element 20 and the result is a resistance or voltage level across adjacent output element 30. Logic device 10A, 10B includes a sensing circuit 15 electrically connected to output element 30 to measure the resistance or voltage or resistance level.

Since magnetic tunneling junction contributes the majority of the resistance or voltage across output element 30, the resistance and voltage of the element is determined, in large part, by the magnetization orientation of pinned layer 32 and free layer 34. Because pinned layer 32 has its magnetization orientation fixed, change in the magnetization orientation of free layer 34 will change the resistance and the logic bit state of output element 30. The resistance state of magnetic element 30 may be a low resistance state ($R_L$) or a high resistance state ($R_H$). Similarly, the voltage across magnetic element 30 may be a high voltage ($V_H$) or a low voltage ($V_L$). It is well established that when the magnetization orientations of the free layer and pinned layer are parallel, the resistance and voltage across the element is low, and that when the magnetization orientations of the free layer and the pinned layer are antiparallel, the resistance and voltage of the element is high.

FIGS. 1A and 1B illustrate the altering of the magnetization orientation of free layer 24 due to the input current applied to input device 20, and the altering of the magnetization orientation of free layer 34 of output device 30 due to its proximity to free layer 24. In both figures, the magnetization orientations of pinned layers 22, 32 are fixed having the same orientation.

In FIG. 1A, a current passes through input magnetic element 20 in the direction of pinned layer 22 to free layer 24. This direction of current orients the magnetization orientation of free layer 24 to be antiparallel to the orientation of pinned layer 22. Due to magnetostatic coupling, the adjacent free layer, free layer 34 of output magnetic element 30, orients itself to be parallel to free layer 24.

In FIG. 1B, a current passes through input magnetic element 20 in the direction of free layer 24 to pinned layer 22. This direction of current orients the magnetization orientation of free layer 24 to be parallel to the orientation of pinned layer 22. Due to magnetostatic coupling, the adjacent free layer, free layer 34 of output magnetic element 30, orients itself to be parallel to free layer 24.

In this embodiment, for this discussion, current flowing through element 20 in an upward direction (as in FIG. 1A) is defined as "0" and current flowing through element 20 in a downward direction (as in FIG. 1B) is defined as "1". On the output side, low resistance or low voltage across element 30 is defined as "0" and high resistance or high voltage is defined as "1". In FIG. 1A, inputted is "0" and the resulting output is "1"; in FIG. 1B, inputted is "1" and the resulting output is "0". This logic device is an inverter.

In some embodiments, it may be desired to use different definitions for the input current or for the output resistance or voltage. For example, if the definition of current flow is as defined above, but on the output side, low resistance or low voltage across element 30 is defined as "1" and high resistance or high voltage is defined as "0", then in FIG. 1A, inputted is "0" and the resulting output is "0", and in FIG. 1B, inputted is "1" and the resulting output is "1". As another example, opposite to the discussion above, if current flowing through element 20 in an upward direction (as in FIG. 1A) is defined as "1" and current flowing through element 20 in a downward direction (as in FIG. 1B) is defined as "0", and on the output side, low resistance or low voltage across element 30 is defined as "0" and high resistance or high voltage is defined as "1", then in FIG. 1A, inputted is "1" and the resulting output is "1", and in FIG. 1B, inputted is "0" and the resulting output is "0". Such a logic device is a follower (e.g., a magnetic digital follower).

Figure 2A:
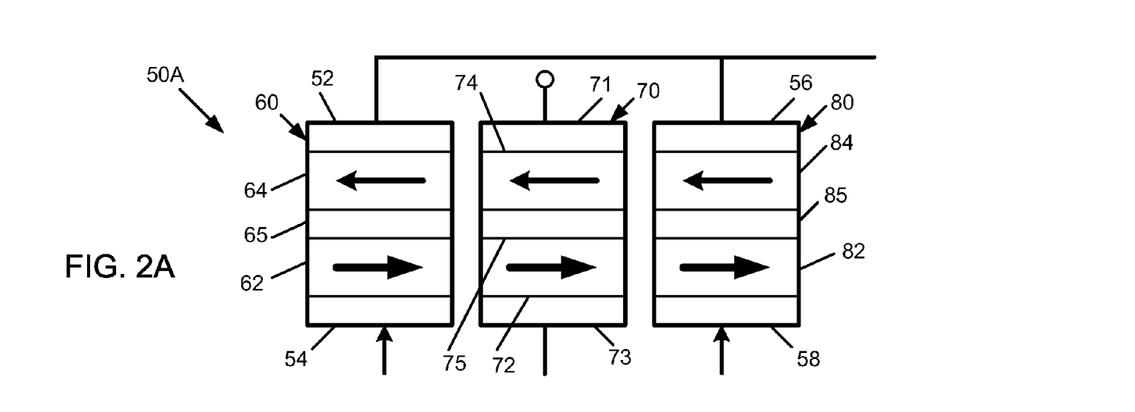
FIGS. 2A and 2B are schematic diagrams of a second embodiment of a logic device according to the present disclosure, in particular a magnetic digital inverter.
Figure 2B:
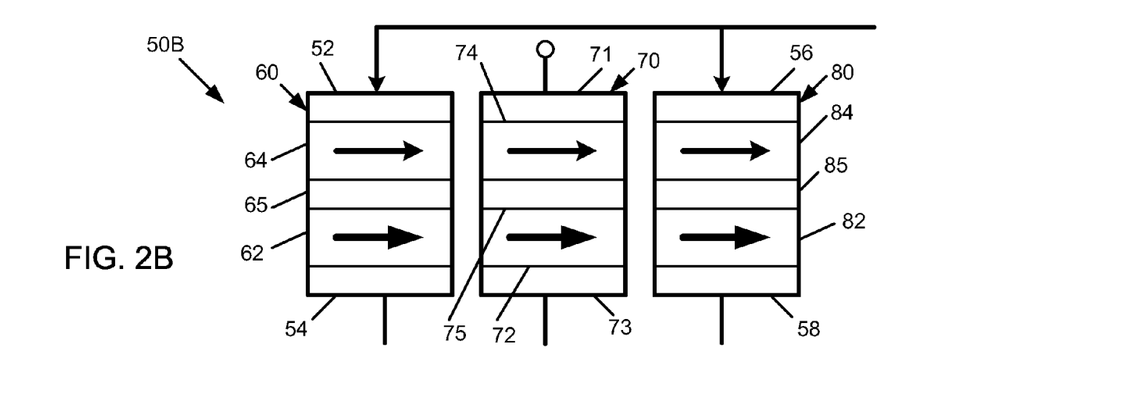

Another embodiment of a digital inverter is illustrated in FIGS. 2A and 2B. This embodiment utilizes two input magnetic elements, increasing the programmability of the logic device.

In FIGS. 2A and 2B, an embodiment of a magnetic logic device 50A, 50B, respectively, is diagrammatically illustrated. The difference between logic device 50A of FIG. 2A and logic device 50B of FIG. 2B will be described below. Logic device 50A, 50B includes a first magnetic element 60, a second magnetic element 70 physically positioned adjacent to first magnetic element 60, and a third magnetic element 80 physically positioned adjacent to second magnetic element 70, so that second magnetic element 70 is positioned between first and third magnetic elements 60, 80.

First magnetic element 60 includes a ferromagnetic pinned layer 62, a ferromagnetic free layer 64, and a nonmagnetic barrier layer 65. Second magnetic element 70 includes a ferromagnetic pinned layer 72, a ferromagnetic free layer 74, and a nonmagnetic barrier layer 75. Third magnetic element 80 also includes a ferromagnetic pinned layer 82, a ferromagnetic free layer 84, and a nonmagnetic barrier layer 85. Each of pinned layers 62, 72, 82 and free layers 64, 74, 84 has a magnetic orientation or magnetization orientation associated therewith.

Magnetic elements 60, 70, 80 include electrodes 52, 71, 56 adjacent free layers 64, 74, 84, respectively, and electrodes 54, 73, 58 adjacent pinned layers 62, 72, 82, respectively. Although shown, the invention behind logic device 50A, 50B does not rely on electrodes 52, 54, 71, 72, 56, 58. Note that other layers are not depicted for clarity.

Logic device 50A, 50B according to this disclosure includes two input elements and an output element. In the embodiment of FIGS. 2A and 2B, first magnetic element 60 is an input element, second magnetic element 70 is an output element, and third magnetic element 80 is a second input element. In accordance with this disclosure, an electric current is applied through input elements 60, 80 and the result is a resistance or voltage level across adjacent output element 70. Logic device 50A, 50B includes a sensing circuit electrically connected to output element 70 to measure the resistance or voltage level. In this embodiment, input elements 60, 80 are configured in parallel.

FIGS. 2A and 2B illustrate the defining of the magnetization orientation of free layer 64 due to the input current applied to input device 60 and the altering of the magnetization orientation of free layer 84 due to the input current applied to input device 80. The result is the magnetization orientation of free layer 74 of output device 70 due to its proximity to free layers 64, 84.

In FIG. 2A, a current passes through input magnetic elements 60, 80 in the direction of pinned layer 62, 82 to free layer 64, 84. This direction of current orients the magnetization orientation of free layers 64, 84 to be antiparallel to the orientation of pinned layers 62, 82. Due to magnetostatic coupling, the adjacent free layer, free layer 74 of output magnetic element 30, orients itself in the same orientation as free layers 64, 84.

In FIG. 2B, a current passes through input magnetic elements 60, 80 in the direction of free layer 64, 84 to pinned layer 62, 82. This direction of current orients the magnetization orientation of free layers 64, 84 to be parallel to the orientation of pinned layers 62, 82. Due to magnetostatic coupling, the adjacent free layer, free layer 74 of output magnetic element 70, orients itself to be in the same orientation as free layers 64, 84.

In this embodiment, for this discussion, current flowing through input elements 60, 80 in an upward direction (as in FIG. 2A) is defined as "0" and current flowing through elements 60, 80 in a downward direction (as in FIG. 2B) is defined as "1". On the output side, low resistance or low voltage across element 70 is defined as "0" and high resistance or high voltage is defined as "1". In FIG. 2A, inputted is "0" and the resulting output is "1"; in FIG. 2B, inputted is "1" and the resulting output is "0". This logic device is an inverter. In some embodiments, it may be desired to use different definitions for the input current or for the output resistance or voltage. Logic devices, such as followers, can be made in this manner.

Binary logic devices can also be made with magnetic elements, in accordance with this disclosure. An embodiment of an AND gate is schematically illustrated in FIGS. 3A through 3D, composed of two input magnetic elements and an output magnetic element.

In FIGS. 3A through 3D, an embodiment of a magnetic logic AND gate is diagrammatically illustrated. Logic device 100A, 100B, 100C, 100D includes a first magnetic element 110, a second magnetic element 120 physically positioned adjacent to first magnetic element 110, and a third magnetic element 130 physically positioned adjacent to second magnetic element 120, so that second magnetic element 120 is positioned between first and third magnetic elements 110, 140. Unlike the inverter of FIGS. 2A and 2B having two input magnetic elements and an output magnetic element, the two input magnetic elements are not electrically coupled.

First magnetic element 110 includes a ferromagnetic pinned layer 112, a ferromagnetic free layer 114, and a nonmagnetic barrier layer 115. Second magnetic element 120 includes a ferromagnetic pinned layer 122, a ferromagnetic free layer 124, and a nonmagnetic barrier layer 125. Third magnetic element 130 also includes a ferromagnetic pinned layer 132, a ferromagnetic free layer 134, and a nonmagnetic barrier layer 135. Each of pinned layers 112, 122, 132 and free layers 114, 124, 134 has a magnetic orientation or magnetization orientation associated therewith.

Magnetic elements 110, 120, 130 include electrodes 102, 121, 106 adjacent free layers 114, 124, 134, respectively, and electrodes 104, 123, 108 adjacent pinned layers 112, 122, 132, respectively. Although shown, the invention behind logic device 100A, 100B, 100C, 100D does not rely on electrodes 102, 104, 121, 123, 106, 108. Note that other layers are not depicted for clarity.

Logic device 100A, 100B, 100C, 100D according to this disclosure includes two input elements and an output element; first magnetic element 110 is an input element, second magnetic element 120 is an output element, and third magnetic element 130 is a second input element. In accordance with this disclosure, an electric current is independently applied through input elements 110, 130 and the result is a resistance or voltage level across adjacent output element 120.

FIGS. 3A through 3D illustrate the defining of the magnetization orientation of free layer 114 due to the input current applied to input device 110, the altering of free layer 134 due to the input current applied to input device 130, and the resulting magnetization orientation of free layer 124 of output device 120 due to its proximity to free layers 114, 134.

Figure 3A:
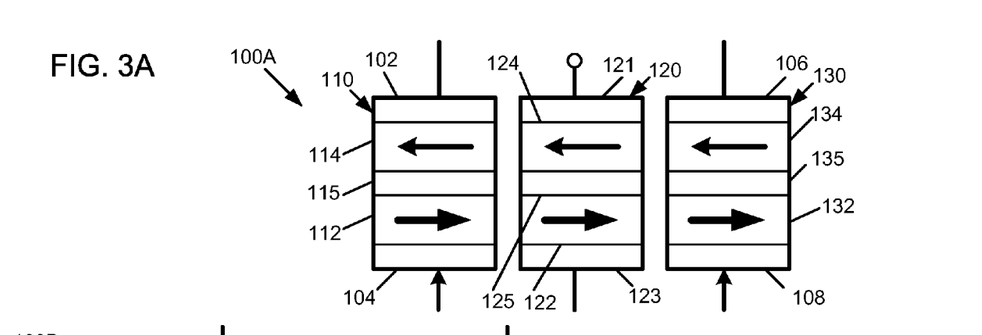
FIGS. 3A through 3D are schematic diagrams of a third embodiment of a logic device according to the present disclosure, in particular, an AND gate.

In FIG. 3A, a first current passes through input magnetic element 110 in the direction of pinned layer 112 to free layer 114. This direction of current orients the magnetization orientation of free layer 114 to be antiparallel to the orientation of pinned layer 112. A second, independent, current passes through input magnetic element 130 in the direction of pinned layer 132 to free layer 134. This direction of current orients the magnetization orientation of free layer 134 to be antiparallel to the orientation of pinned layer 132. In this embodiment, both free layers 114, 134 have the same directional magnetization orientation. Due to magnetostatic coupling, the adjacent free layer, free layer 124 of output magnetic element 120, orients itself to the same orientation as free layers 114, 134.

Figure 3B:
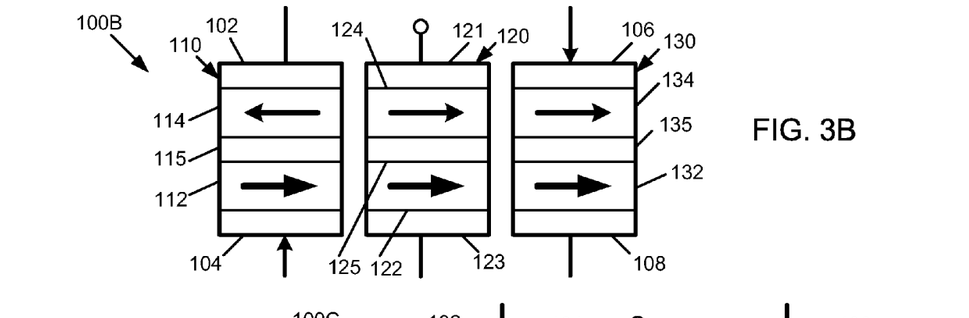

In FIG. 3B, a first current passes through input magnetic element 110 in the direction of pinned layer 112 to free layer 114 so that the resulting magnetization orientation of free layer 114 is antiparallel to the orientation of pinned layer 112. A second, independent, current passes through input magnetic element 130 in the direction of free layer 134 to pinned layer 132. This direction of current orients the magnetization orientation of free layer 134 to be parallel to the orientation of pinned layer 132. In this embodiment, the magnetization of free layer 134 is opposite to that of free layer 114. Free layer 124 of output element 120 has a default magnetization orientation of parallel to its pinned layer, layer 122.

Figure 3C:
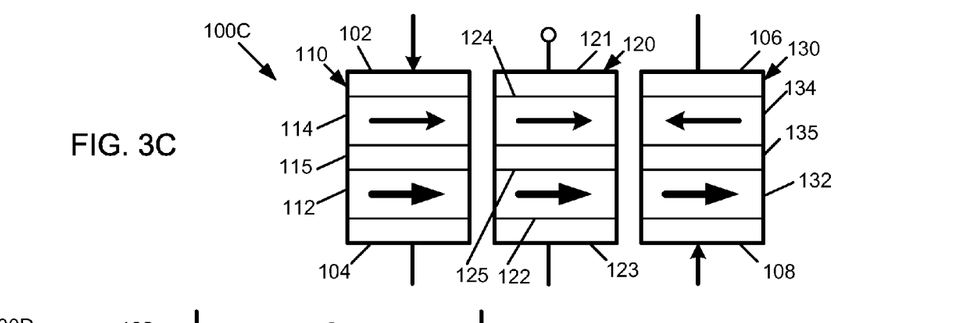

FIG. 3C is similar, yet opposite, to FIG. 3B. A first current passes through input magnetic element 110 in the direction of free layer 114 to pinned layer 112 so that the resulting magnetization orientation of free layer 114 is parallel to the orientation of pinned layer 112. A second, independent, current passes through input magnetic element 130 in the direction of pinned layer 132 to free layer 134. This direction of current orients the magnetization orientation of free layer 134 to be antiparallel to the orientation of pinned layer 132. In this embodiment, the magnetization of free layer 134 is opposite to that of free layer 114. Free layer 124 of output element 120 has a default magnetization orientation of parallel to its pinned layer, layer 122.

Figure 3D:
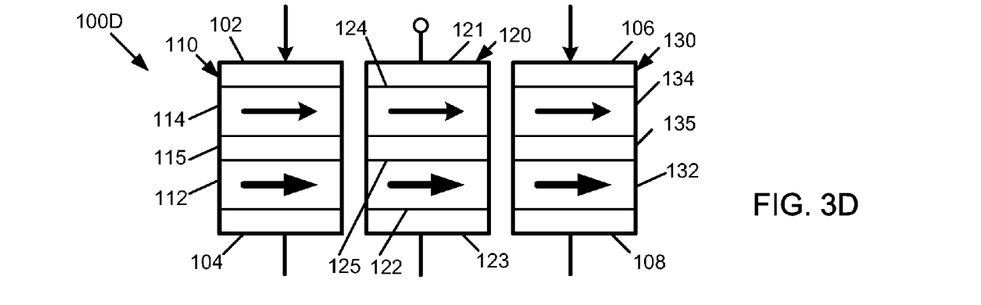

FIG. 3D is similar, yet opposite, to FIG. 3A. A first current passes through input magnetic element 110 in the direction of free layer 114 to pinned layer 112 so that the resulting magnetization orientation of free layer 114 is parallel to the orientation of pinned layer 112. A second, independent, current passes through input magnetic element 130 in the direction of free layer 134 to pinned layer 132. This direction of current orients the magnetization orientation of free layer 134 to be parallel to the orientation of pinned layer 132. Due to magnetostatic coupling, free layer 124 of output magnetic element 120 orients itself in the same orientation as free layers 114, 134.

In this embodiment, for this discussion, current flowing through input elements 110, 130 in an upward direction (as in FIG. 3A) is defined as "1" and current flowing through elements 110, 130 in a downward direction (as in FIG. 3D) is defined as "0". On the output side, low resistance or low voltage across element 120, due to free layer 124 parallel with pinned layer 122, is defined as "0" and high resistance or high voltage is defined as "1". The input levels and output for the four configurations of FIGS. 3A through 3D is summarized below in Table 1.

TABLE 1

| Figure | input 110 | input 130 | output 120 |
|---|---|---|---|
| FIG. 3A | 1 | 1 | 1 |
| FIG. 3B | 1 | 0 | 0 |
| FIG. 3C | 0 | 1 | 0 |
| FIG. 3D | 0 | 0 | 0 |

An embodiment of an XOR gate is schematically illustrated in FIGS. 4A through 4D, composed of two independent input magnetic elements and an output magnetic element. Unlike the previous embodiments discussed above, the output magnet element of this embodiment has two ferromagnetic free layers, rather than one free layer and one pinned layer.

In FIGS. 4A through 4D, logic device 140A, 140B, 140C, 140D includes a first magnetic element 150, a second magnetic element 160 physically positioned adjacent to first magnetic element 150, and a third magnetic element 170 physically positioned adjacent to second magnetic element 160, so that second magnetic element 160 is positioned between first and third magnetic elements 150, 170.

First magnetic element 150 includes a ferromagnetic pinned layer 152, a ferromagnetic free layer 154, and a nonmagnetic barrier layer 155. Second magnetic element 160 includes a first ferromagnetic free layer 162, a second ferromagnetic free layer 164, and a nonmagnetic barrier layer 165. Third magnetic element 170 also includes a ferromagnetic pinned layer 172, a ferromagnetic free layer 174, and a nonmagnetic barrier layer 175. Each of pinned layers 152, 172 and free layers 154, 162, 164, 172 has a magnetic orientation or magnetization orientation associated therewith. Not illustrated are various additional layers that might be present in elements 150, 160, 170 but that do not affect the function of logic device 140A, 140B, 140C, 140D.

Logic device 140A, 140B, 140C, 140D includes two input elements and an output element; first magnetic element 150 is an input element, second magnetic element 160 is an output element, and third magnetic element 170 is a second input element. An electric current is independently applied through input elements 150, 170 and the result is a resistance or voltage level across adjacent output element 160.

FIGS. 4A through 4D illustrate the defining of the magnetization orientation of free layer 154 due to the input current applied to input device 150, the defining of the magnetization orientation of free layer 174 due to the input current applied to input device 170, and the resulting magnetization orientation of free layer 162 of output device 160 due to its proximity to free layer 174, and the resulting magnetization orientation of free layer 164 due to its proximity to free layer 154. In this XOR gate, the magnetization orientations of two layers within output device 160 are defined by the two input elements.

Figure 4A:
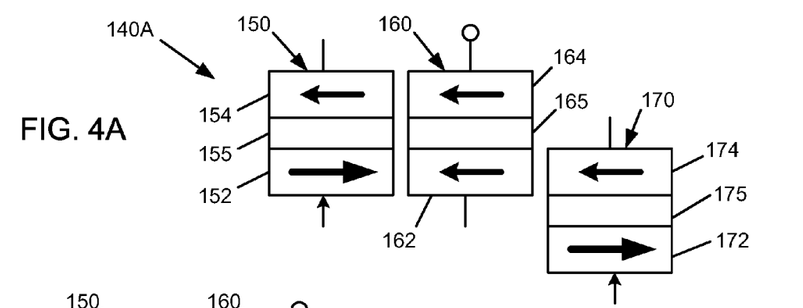
FIGS. 4A through 4D are schematic diagrams of a fourth embodiment of a logic device according to the present disclosure, in particular, an XOR gate.

In FIG. 4A, a first current passes through input magnetic element 150 to result in an antiparallel orientation of pinned layer 152 and free layer 154. Output element 160 is positioned with free layer 164 magnetostatically coupled to free layer 154 of input element 150. Thus, free layer 164 orients itself to the same orientation as free layer 154. A second, independent, current passes through input magnetic element 170 to result in an antiparallel orientation of pinned layer 172 and free layer 174. Input element 170 is positioned with free layer 174 magnetostatically coupled to free layer 162 of output element 160. Thus, free layer 162 orients itself to the same orientation as free layer 174.

Figure 4B:
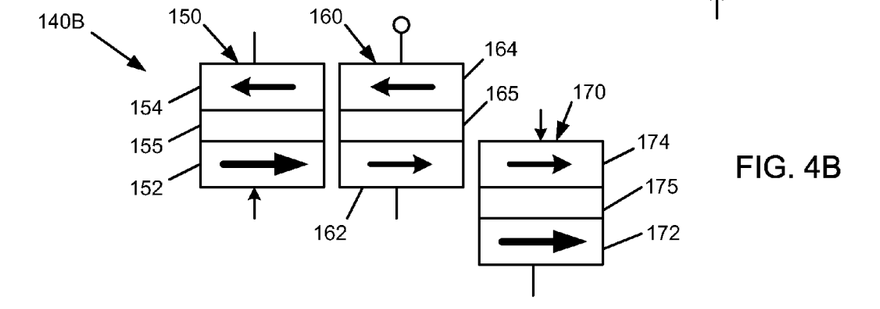

In FIG. 4B, a first current passes through input magnetic element 150 to result in an antiparallel orientation of pinned layer 152 and free layer 154. Free layer 164 orients itself to the same orientation as free layer 154. A second, independent, current passes through input magnetic element 170 to result in a parallel orientation of pinned layer 172 and free layer 174. Free layer 162 orients itself to the same orientation as free layer 174.

Figure 4C:
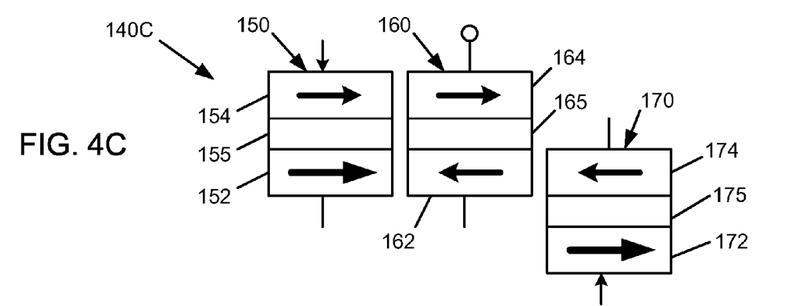

Similarly in FIG. 4C, current passes through input magnetic element 150 to result in a parallel orientation of pinned layer 152 and free layer 154. Free layer 164 orients itself to the same orientation as free layer 154. A second, independent, current passes through input magnetic element 170 to result in an antiparallel orientation of pinned layer 172 and free layer 174. Free layer 162 orients itself to the same orientation as free layer 174.

Figure 4D:
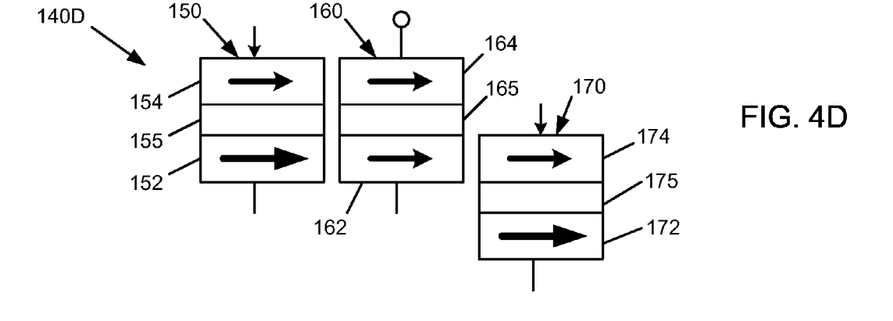

And again in FIG. 4D, a first current passes through input magnetic element 150 to result in a parallel orientation of pinned layer 152 and free layer 154. Free layer 164 orients itself to the same orientation as free layer 154. A second, independent, current passes through input magnetic element 170 to result in a parallel orientation of pinned layer 172 and free layer 174. Free layer 162 orients itself to the same orientation as free layer 174.

In this embodiment, for this discussion, current flowing through input elements 150, 170 in an upward direction (as in FIG. 4A) is defined as "1" and current flowing through elements 150, 170 in a downward direction (as in FIG. 4D) is defined as "0". On the output side, low resistance or low voltage across element 160, due to free layer 164 parallel with free layer 162, is defined as "0" and high resistance or high voltage is defined as "1". The input levels and output for the four configurations of FIGS. 4A through 4D is summarized below in Table 2.

TABLE 2

| Figure | input 150 | input 170 | output 160 |
|---|---|---|---|
| FIG. 4A | 1 | 1 | 0 |
| FIG. 4B | 1 | 0 | 1 |
| FIG. 4C | 0 | 1 | 1 |
| FIG. 4D | 0 | 0 | 0 |

Figure 5:
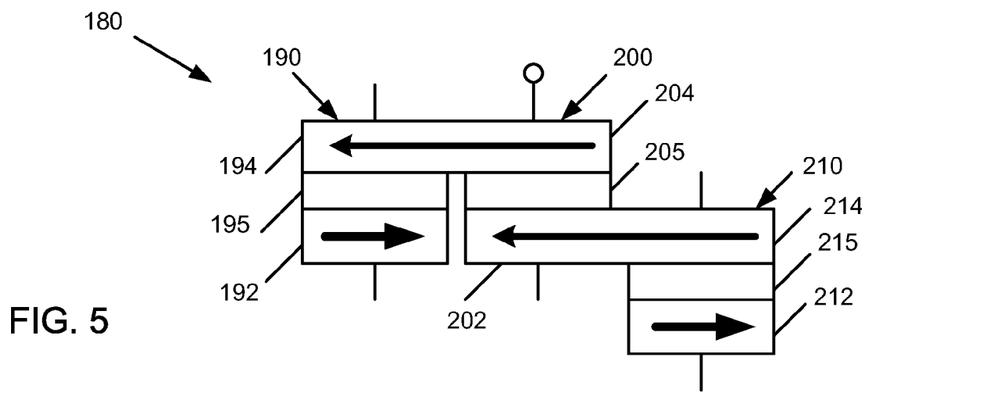
FIG. 5 is a schematic diagram of a fifth embodiment of a logic device according to the present disclosure, in particular, an XOR gate.
Figure 6:
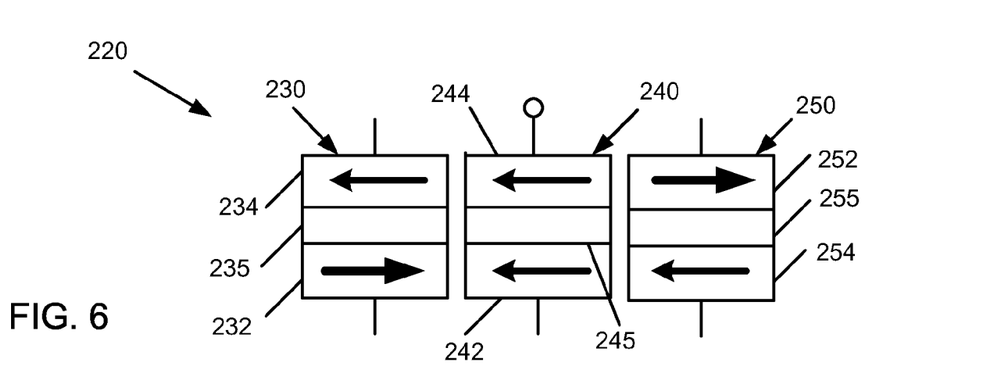
FIG. 6 is a schematic diagram of a sixth embodiment of a logic device according to the present disclosure, in particular, an XOR gate.
Figure 7:
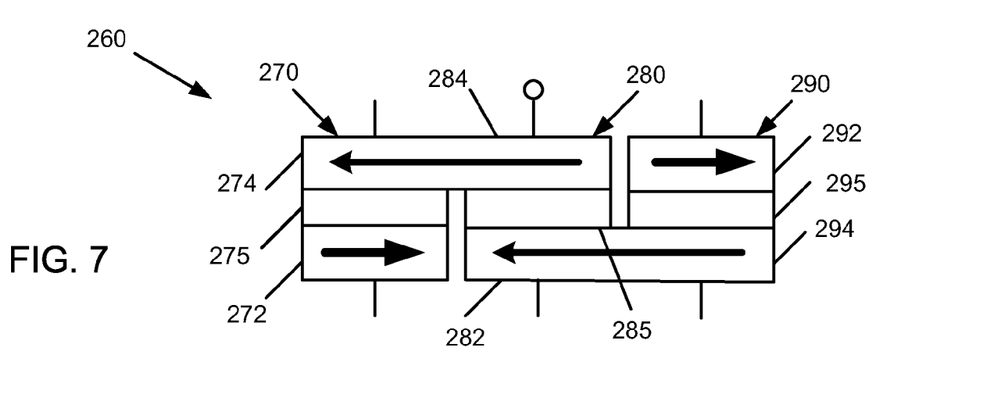
FIG. 7 is a schematic diagram of a seventh embodiment of a logic device according to the present disclosure, in particular, an XOR gate.

Alternative structures of XOR gates are illustrated in FIGS. 5 through 7. The various features of these logic device and magnetic elements are generally the same as described above for the other embodiments, unless specifically indicated otherwise. In the embodiments of FIGS. 5 and 7, the output elements have free layers that are shared with, and physically connected to the free layers of the input elements.

In FIG. 5, a logic device 180 is illustrated, having a first magnetic element 190 (an input element), a second magnetic element 200 (an output element) and a third magnetic element 210 (an input element). Similar to the XOR gate of FIGS. 4A through 4D, the output element (element 200) has two free layers, which have alterable magnetization orientations.

As illustrated in FIG. 5, input element 190 has a pinned layer 192, a free layer 194 and a barrier layer 195 therebetween. Input element 210 has a pinned layer 212, a free layer 214 and a barrier layer 215 therebetween. Output element 200 has a first free layer 202 and a second free layer 204, with a barrier layer 205 therebetween. First free layer 202 is coextensive with free layer 214 of output element 210; free layer 202 is physically connected to free layer 214. Similarly, second free layer 204 is coextensive with free layer 194 of output element 190; free layer 204 is physically connected to free layer 194. Pinned layer 212 of second input element 210 extends alone, that is, it is not planar or aligned with any layer of input element 190 or output element 200. Pinned layer 212 is positioned on the opposite side of coextensive free layer 202/214 as coextensive free layer 194/204. In the schematic FIG. 5, pinned layer 212 is positioned below the other layers.

For logic device 180, current applied to input elements 190, 210 will orient free layer 194, 214, and will directly orient connected free layers 204, 202, respectively.

Another alternate XOR gate is illustrated in FIG. 6 as logic device 220. Device 220 has a first magnetic element 230 (an input element) having a pinned layer 232, a free layer 234 and a barrier layer 235 therebetween, a second magnetic element 240 (an output element) having a first free layer 242 and a second free layer 244, with a barrier layer 245 therebetween, and a third magnetic element 250 (output element) having a pinned layer 252, a free layer 254 and a barrier layer 255 therebetween.

Unlike the previously described logic devices and magnetic elements, third magnetic element 250 is physically rotated in this embodiment. That is, pinned layer 252 is physically positioned over free layer 254, unlike in all the previous elements where the pinned layer was positioned below the free layer.

The general operation of logic device 220 is the same as others described above. Current applied to input element 230 will orient free layer 234 either parallel or antiparallel to pinned layer 232. Similarly, current applied to input element 250 will orient free layer 254 either parallel or antiparallel to pinned layer 252. Free layer 242 will orient itself to the same orientation as free layer 254, and free layer 242 will orient itself to the same orientation as free layer 234.

Logic device 260 of FIG. 7 is a combination of features from device 180 and device 220. Device 260 has a first magnetic element 270 (an input element) having a pinned layer 272, a free layer 274 and a barrier layer 275 therebetween, a second magnetic element 280 (an output element) having a first free layer 282 and a second free layer 284, with a barrier layer 285 therebetween, and a third magnetic element 290 (input element) having a pinned layer 292, a free layer 294 and a barrier layer 295 therebetween.

Similar to device 220 of FIG. 6, third magnetic element 290 is physically rotated with pinned layer 292 physically positioned over free layer 294. Similar to device 180 of FIG. 5, free layer 282 is physically connected to free layer 294, and free layer 284 is physically connected to free layer 274. Unlike device 180 of FIG. 5, however, pinned layer 292 is positioned on the same side of coextensive free layer 282/294 as coextensive free layer 274/284.

For logic device 260, current applied to input elements 270, 290 will orient free layer 274, 294, respectively, and will directly orient connected free layers 284, 282, respectively.

Figure 8:
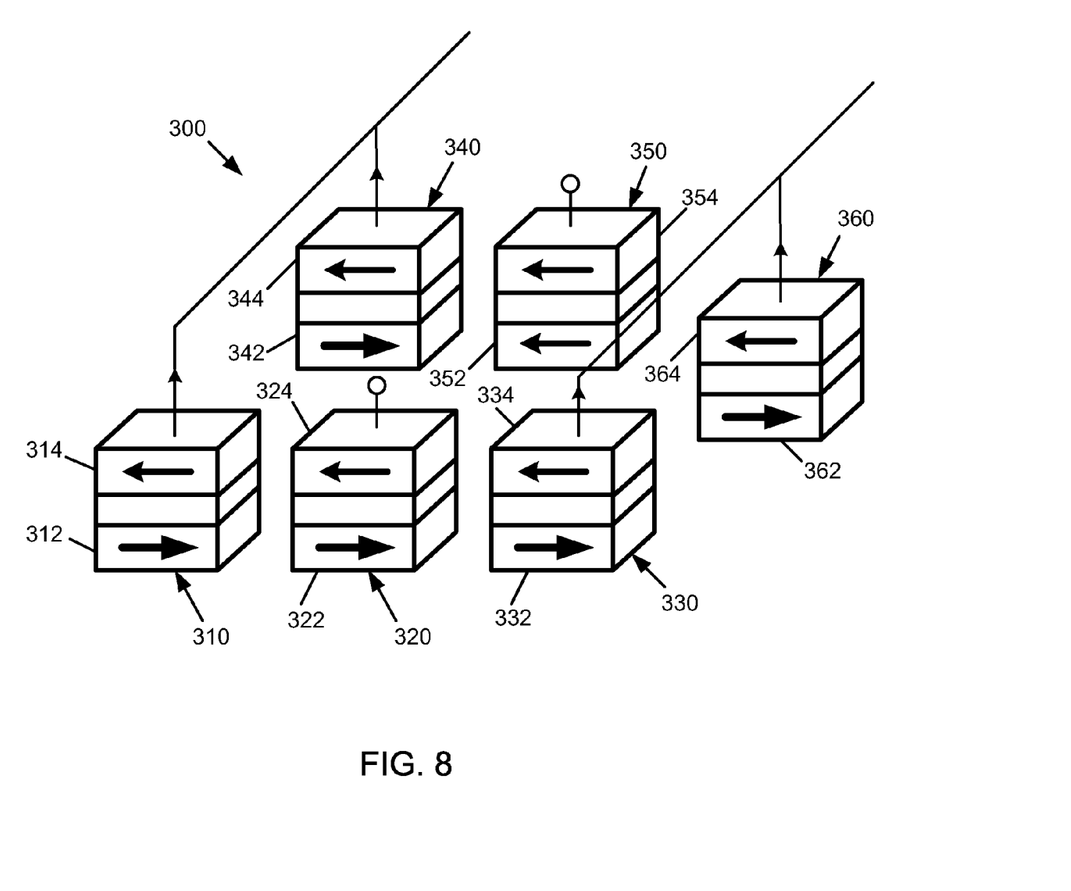
FIG. 8 is a schematic diagram of an eighth embodiment of a logic device according to the present disclosure, in particular, a half-adder composed of an AND gate and an XOR gate.

Another type of logic device is illustrated in FIG. 8. Logic device 300 is a half-adder, combining an AND gate and a XOR gate. In the illustrated embodiment, the input elements of the two gates are connected in parallel; in alternate embodiments, the input elements of the two gates could be connected in series. Also in the illustrated embodiment, the output of the AND gate is the "carryout", and the output of ht XOR gate is the "sum" of the output.

Referring to FIG. 8, logic device 300 is composed of six magnetic elements, 310, 320, 330, 340, 350 and 360.

Magnetic element 310, an input element, has a pinned layer 312, a free layer 314, and a barrier layer therebetween. Magnetic element 320, an output element, has a pinned layer 322, a free layer 324, and a barrier layer therebetween. Magnetic element 330, an input element, has a pinned layer 332, a free layer 334, and a barrier layer therebetween. Magnetic element 340, an input element, has a pinned layer 342, a free layer 344, and a barrier layer therebetween. Magnetic element 350, an output element, has a first free layer 352, a second free layer 354, and a barrier layer therebetween. Magnetic element 360, an input element, has a pinned layer 362, a free layer 364, and a barrier layer therebetween. Elements 310, 320, 330 form an AND gate; elements 340, 350, 360 form an XOR gate. Input elements 310 and 340 are electrically connected in parallel, and input element 330 and 360 are electrically connected in parallel; it is noted that not all electrical connections are illustrated in FIG. 8. Output element 320 is magnetostatically coupled to input elements 310 and 330, and output element 350 is magnetostatically coupled to input elements 340 and 360.

The input levels and output for the half-adder of FIG. 8 are summarized below in Table 3.

TABLE 3

| Input 310, 340 | Input 330, 360 | Output 320 (AND gate) | Output 350 (XOR gate) |
|---|---|---|---|
| 1 | 1 | 1 | 0 |
| 1 | 0 | 0 | 1 |
| 0 | 1 | 0 | 1 |
| 0 | 0 | 0 | 0 |

Various configurations for magnetic logic elements have been discussed above. Thus, numerous embodiments of the NON-VOLATILE PROGRAMMABLE LOGIC GATES AND ADDERS are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a system, apparatus or method. For example, if a device includes a first input magnetic element, it should not be implied that a second input magnetic element is required in that device.

What is claimed is:

1. A device comprising:
   a first magnetic element comprising a ferromagnetic pinned layer, a ferromagnetic free layer, and a nonmagnetic barrier layer therebetween, the ferromagnetic pinned layer and the ferromagnetic free layer each having a magnetization orientation;
   a second magnetic element; and
   a sensing circuit electrically connected to the second magnetic element to measure voltage or resistance across the second magnetic element,
   wherein the second magnetic element is positioned physically adjacent to the first magnetic element.

2. The device of claim 1, wherein the first magnetic element and the second magnetic element are about 100 nm apart.

3. The device of claim 1, wherein the first magnetic element and the second magnetic element are magnetostatically coupled.

4. The device of claim 1, wherein the first magnetic element further comprises a first electrode and a second electrode, wherein the first electrode is adjacent the ferromagnetic free layer and the second electrode is adjacent the ferromagnetic pinned layer.

5. The device of claim 1, wherein the second magnetic element comprises a ferromagnetic pinned layer, a ferromagnetic free layer, and a nonmagnetic barrier layer therebetween, the ferromagnetic pinned layer and the ferromagnetic free layer each having a magnetization orientation.

6. The device of claim 5, wherein the second magnetic element further comprises a first electrode and a second electrode, wherein the first electrode is adjacent the ferromagnetic free layer and the second electrode is adjacent the ferromagnetic pinned layer.

7. The device of claim 5, wherein the ferromagnetic pinned layer of the first magnetic element is proximate the ferromagnetic pinned layer of the second magnetic element; and the ferromagnetic free layer of the first magnetic element is proximate the ferromagnetic free layer of the second magnetic element.

8. The device of claim 7 further comprising a third magnetic element, wherein the second magnetic element is positioned between the first magnetic element and the third magnetic element.

9. The device of claim 8, wherein the third magnetic element comprises a ferromagnetic pinned layer, a ferromagnetic free layer, and a nonmagnetic barrier layer therebetween, the ferromagnetic pinned layer and the ferromagnetic free layer each having a magnetization orientation.

10. The device of claim 9, wherein the ferromagnetic pinned layer of the first magnetic element is proximate the ferromagnetic pinned layer of the second magnetic element; and the ferromagnetic pinned layer of the second magnetic element is proximate the ferromagnetic pinned layer of the third magnetic element.

11. The logic device of claim 8, wherein the first magnetic element is electrically connected in parallel to the third magnetic element.

12. The logic device of claim 8, wherein the first magnetic element is electrically connected in series to the third magnetic element.

13. The device of claim 1, wherein the second magnetic element comprises a first ferromagnetic free layer, a second ferromagnetic free layer and a nonmagnetic barrier layer therebetween, with the first ferromagnetic free layer and the second ferromagnetic free layer each having a magnetization orientation.

14. The device of claim 13, wherein the ferromagnetic pinned layer of the first magnetic element is proximate the second ferromagnetic free layer of the second magnetic element; and a ferromagnetic free layer of a third magnetic element is proximate the second ferromagnetic free layer of the second magnetic element.

15. The device of claim 13, wherein the ferromagnetic pinned layer of the first magnetic element is proximate the second ferromagnetic free layer of the second magnetic element; and the ferromagnetic pinned layer of the third magnetic element is proximate the first ferromagnetic free layer of the second magnetic element.

16. The device of claim 15, wherein the ferromagnetic free layer of the first magnetic element and the first ferromagnetic free layer of the second magnetic element are physically connected.

17. The device of claim 16, wherein the ferromagnetic free layer of the third magnetic element and the second ferromagnetic free layer of the second magnetic element are physically connected.

18. A device comprising:
- a first magnetic element comprising a ferromagnetic pinned layer, a ferromagnetic free layer, and a nonmagnetic barrier layer therebetween, the ferromagnetic pinned layer and the ferromagnetic free layer each having a magnetization orientation;
- a second magnetic element;
- a third magnetic element comprising a ferromagnetic pinned layer, a ferromagnetic free layer, and a nonmagnetic barrier layer therebetween, the ferromagnetic pinned layer and the ferromagnetic free layer each having a magnetization orientation; and
- a sensing circuit electrically connected to the second magnetic element to measure voltage or resistance across the second magnetic element,
- wherein the second magnetic element is positioned between the first magnetic element and the third magnetic element.

19. The device according to claim 18, wherein the second magnetic element comprises a ferromagnetic pinned layer, a ferromagnetic free layer, and a nonmagnetic barrier layer therebetween, the ferromagnetic pinned layer and the ferromagnetic free layer each having a magnetization orientation.

20. A device comprising:
- a first magnetic element comprising a ferromagnetic pinned layer, a ferromagnetic free layer, and a nonmagnetic barrier layer therebetween, the ferromagnetic pinned layer and the ferromagnetic free layer each having a magnetization orientation;
- a second magnetic element comprising a first ferromagnetic free layer, a second ferromagnetic free layer and a nonmagnetic barrier layer therebetween, with the first ferromagnetic free layer and the second ferromagnetic free layer each having a magnetization orientation;
- a third magnetic element comprising a ferromagnetic pinned layer, a ferromagnetic free layer, and a nonmagnetic barrier layer therebetween, the ferromagnetic pinned layer and the ferromagnetic free layer each having a magnetization orientation; and
- a sensing circuit electrically connected to the second magnetic element to measure voltage or resistance across the second magnetic element,
- wherein the second magnetic element is positioned between the first magnetic element and the third magnetic element.

* * * * *